United States Patent [19]
Shinozaki et al.

[11] Patent Number: 5,532,822
[45] Date of Patent: Jul. 2, 1996

[54] METHOD OF MEASURING ORTHOGONALITY OF STAGE UNIT

[75] Inventors: Tadaaki Shinozaki, Kawasaki; Manabu Toguchi, Kawagoe; Kunihiro Kawae, Machida; Kazuo Murano, Sagamihara, all of Japan

[73] Assignee: Nikon Corporation, Tokyo, Japan

[21] Appl. No.: 406,171

[22] Filed: Mar. 17, 1995

[30] Foreign Application Priority Data

Mar. 22, 1994 [JP] Japan ................................. 6-050557

[51] Int. Cl.⁶ ........................................... G01B 9/02
[52] U.S. Cl. ........................... 356/363; 356/399; 356/400
[58] Field of Search ..................... 356/358, 363, 356/399, 400, 401

[56] References Cited

U.S. PATENT DOCUMENTS

| 4,655,594 | 4/1987 | Wittekoek et al. | 356/363 |
| 5,464,715 | 11/1995 | Nishi et al. | 356/399 |

*Primary Examiner*—Samuel A. Turner
*Attorney, Agent, or Firm*—Shapiro and Shapiro

[57] ABSTRACT

A method of measuring the orthogonality of a movement coordinate system of a stage unit having a stage which two-dimensionally moves along the movement coordinate system determined by first and second axes that cross each other, by mounting a measurement substrate having at least three measurement patterns on the stage, the at least three measurement patterns including at least two first patterns arranged on a line parallel to a third axis on an array coordinate system determined by the third and fourth axes crossing each other, and at least two second patterns arranged on a line parallel to the fourth axis; aligning the third axis with respect to the first axis of the movement coordinate system; obtaining a difference in an angle between the fourth axis of the array coordinate system and the second axis of the movement coordinate system as a first deviation by detecting the positions of the second patterns on the movement coordinate system in an aligned state; rotating the measurement substrate by 90 degrees from the aligned state and mounting the measurement substrate on the stage; aligning the fourth axis with respect to the first axis of the movement coordinate system; obtaining a difference in an angle between the third axis of the array coordinate system and the second axis of the movement coordinate system as a second deviation by detecting the positions of the first patterns on the movement coordinate system in the aligned state; and obtaining the orthogonality of the movement coordinate system on the basis of the first and second deviations.

3 Claims, 5 Drawing Sheets

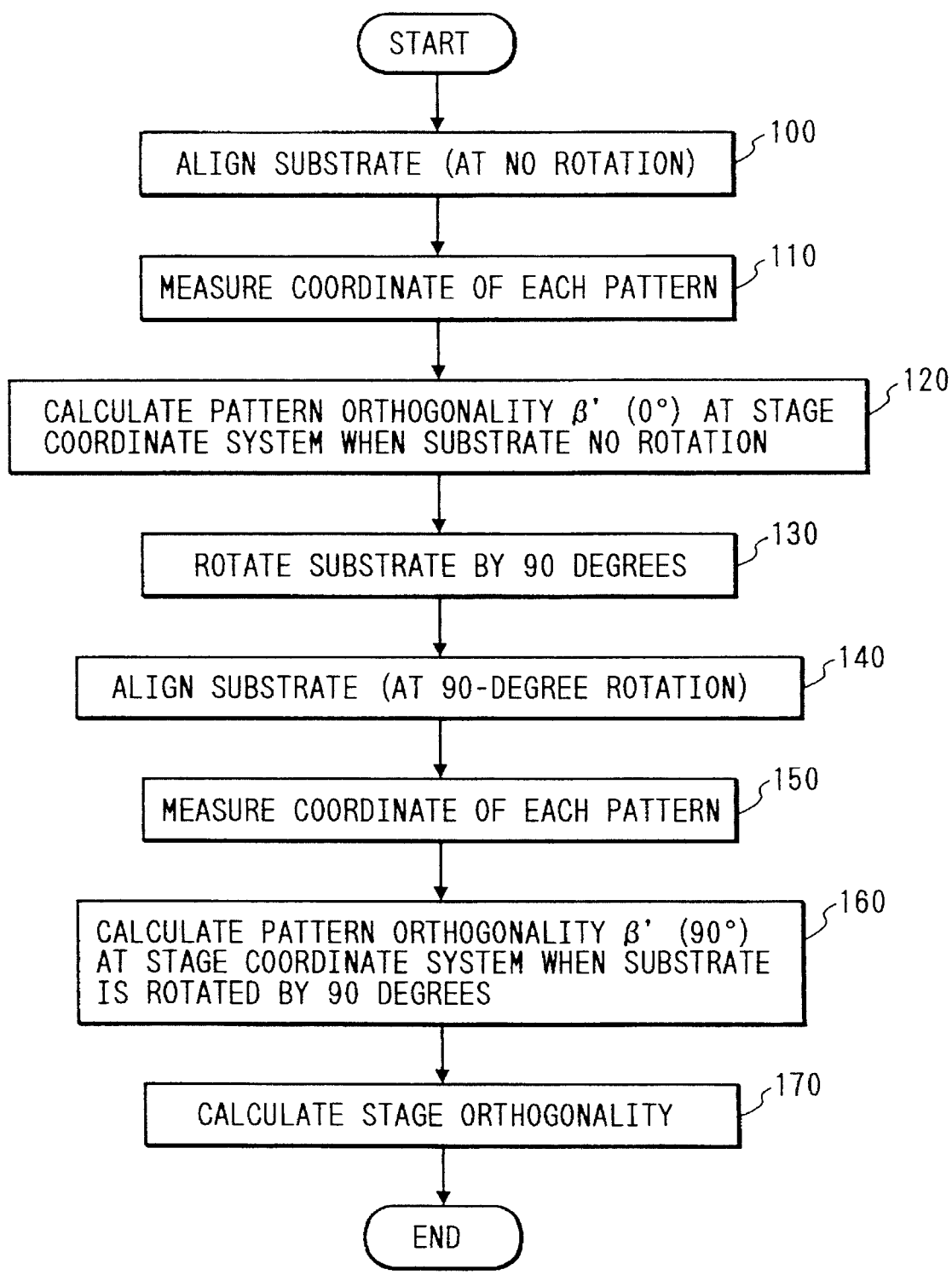

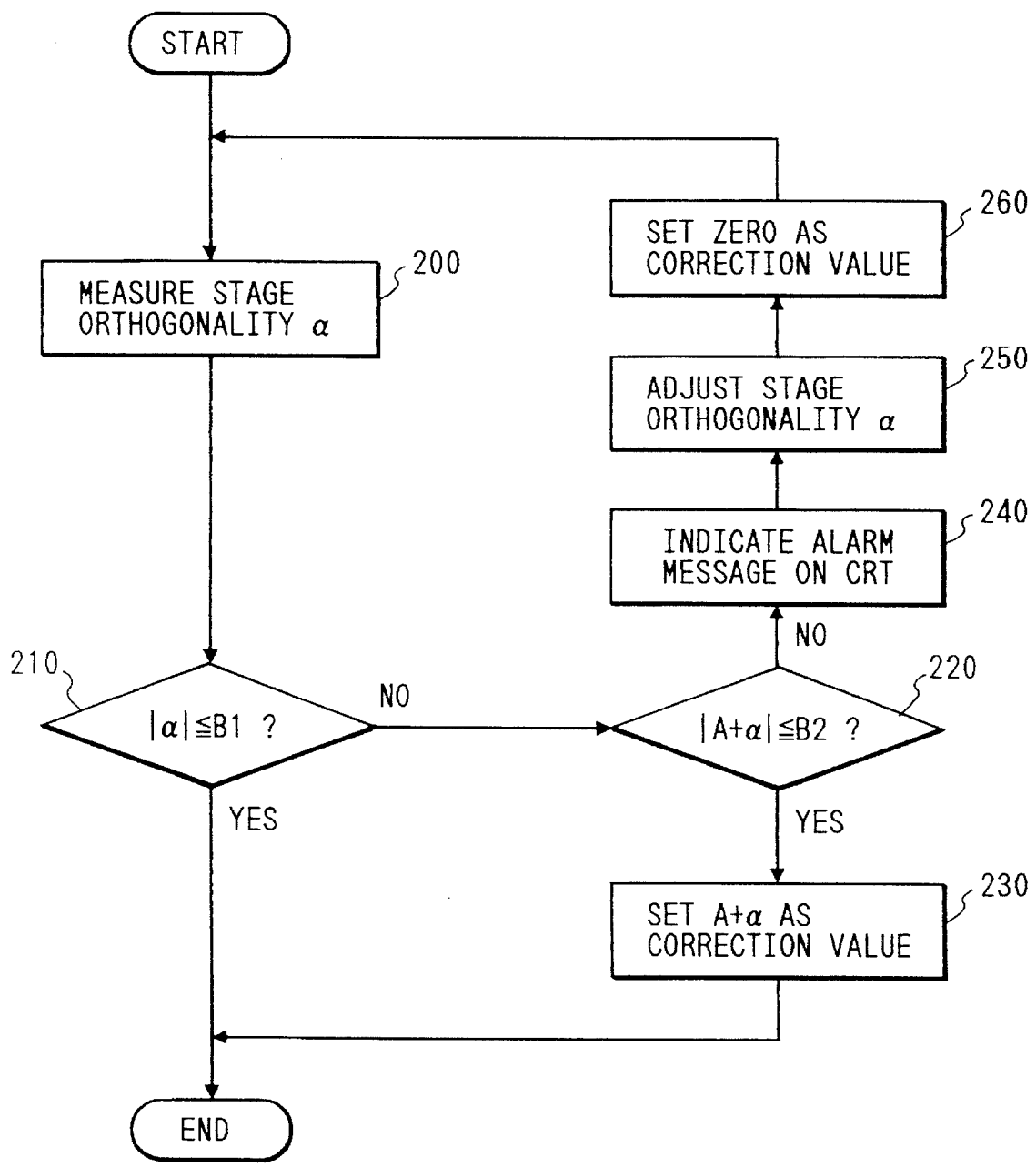

METHOD OF MEASURING ORTHOGONALITY OF STAGE UNIT

BACKGROUND OF THE INVENTION

1. Field of the Invention

The present invention relates to a method of measuring the orthogonality of a movement coordinate system of a stage for two-dimensionally moving a substrate mounted thereon in an exposure apparatus for manufacturing a semiconductor memory, a liquid crystal display, or the like.

2. Related Background Art

In a conventional method of aligning a two-dimensionally movable stage in an exposure apparatus, two plane mirrors are fixed to the stage such that their reflection surfaces are orthogonal to each other, light beams are irradiated onto the two plane mirrors, and the distances to the plane mirrors are measured on the basis of the reflected light beams, thereby performing alignment. In this technique, the two moving axes of the stage are determined by the two plane mirrors, respectively, and a movement coordinate system is defined by the two moving axes. Therefore, if the two plane mirrors have a mounting error (the reflection surfaces are not orthogonal to each other), the X- and Y-axes of the stage movement coordinate system, which are determined by the two plane mirrors, are not completely orthogonal to each other. In this state, when a pattern on a reticle is to be exposed on a photosensitive substrate (to be simply referred to as a substrate hereinafter) mounted on the stage by a so-called step and repeat method, the pattern array coordinate system formed on the substrate has poor orthogonality. For this reason, the exposed pattern is shifted from a desired position (designed target position), i.e., misalignment between the reticle and the substrate occurs.

Conventionally, to correct such alignment error of the stage, test exposure is performed in advance to measure the orthogonality of the stage movement coordinate system. The obtained orthogonality is set as a correction value for alignment of the substrate, thereby performing an exposure operation. In this test exposure, a test pattern is exposed on a substrate mounted on the stage in several shots along the X- and Y-axes of the stage such that, e.g., a cross-shaped shot array is obtained, as shown in FIG. 6. The substrate is then rotated by 90 degrees and mounted. Using one X-direction alignment mark and two Y-direction alignment marks, which are formed in the shots exposed in the first exposure operation, the substrate is aligned in the X, Y, and rotating directions. The test pattern is exposed again as in the first exposure operation.

Thereafter, shift amounts $X_A$ and $X_B$ of the X-direction measurement marks which are formed in the first shot (indicated by a broken line) and the second shot (indicated by a solid line), are measured at a plurality of positions separated from each other by a distance L. The orthogonality, $\alpha$, is approximately obtained in accordance with the following equation:

$$\alpha = (X_A - X_B)/2L \quad \text{(rad)}$$

The shift amounts $X_A$ and $X_B$ are defined to be positive when the second shot position is shifted from the first shot position in the -X direction. The orthogonality $\alpha$ is defined to be positive in the counterclockwise direction.

The stage orthogonality may change due to a change in ambient temperature, an impact upon movement of the stage, or the like. For this reason, the orthogonality need to be periodically measured to update the correction value of the apparatus.

However, in the orthogonality measurement by the conventional test exposure, two exposure operations and the operation of measuring the shift amounts of measurement marks are needed. That is, periodical orthogonality measurements and management require a lot of labor and time. For this reason, actually, test exposure is performed only upon setting up of the exposure apparatus to obtain an orthogonality correction value, and thereafter, no further orthogonality measurement is performed until an exposure failure occurs due to a change in orthogonality.

SUMMARY OF THE INVENTION

The present invention has been made in consideration of the above problem, and has as its object to provide a method in which the load of a stage orthogonality measurement operation is reduced to allow orthogonality management by periodical orthogonality measurements.

In order to solve the above problem, according to the present invention, there is provided a method of measuring an orthogonality of a movement coordinate system of a stage unit having a stage which two-dimensionally moves along the movement coordinate system determined by a first axis (X-axis) and a second axis (Y-axis), that cross each other, comprising the steps of mounting a measurement substrate having at least three measurement patterns on the stage, the at least three measurement patterns including at least two first patterns arranged on a straight line parallel to a third axis on an array coordinate system determined by a third axis (X'-axis) and a fourth axis (Y'-axis), which are orthogonal to each other, and at least two second patterns arranged on a straight line parallel to the fourth axis, aligning the third axis of the array coordinate system of the measurement substrate with respect to the first axis of the movement coordinate system by detecting the first patterns, obtaining a first deviation in an angle between the fourth axis of the array coordinate system and the second axis of the movement coordinate system by detecting positions of the second patterns on the movement coordinate system in an aligned state, rotating the measurement substrate by 90 degrees from the aligned state and mounting the measurement substrate on the stage, aligning the fourth axis of the array coordinate system of the measurement substrate with respect to the first axis of the movement coordinate system by detecting the second patterns, obtaining a second deviation in an angle between the third axis of the array coordinate system and the second axis of the movement coordinate system by detecting positions of the first patterns on the movement coordinate system in the aligned state, and obtaining the orthogonality of the movement coordinate system on the basis of the first and second deviations.

According to the present invention, the measurement substrate on which the patterns are formed in advance is mounted, on the stage which moves along the movement coordinate system, at no rotation and at a 90-degree rotation. Any orthogonality error at the pattern array coordinate system at each rotation is measured using the stage movement coordinate system, and a stage orthogonality is calculated from the measurement result. For this reason, unlike the conventional test exposure performed by a stage orthogonality measurement in an exposure apparatus, two exposure operations and the operation of measuring shift amounts can be eliminated, thereby largely reducing the load of the stage orthogonality measurement operation.

BRIEF DESCRIPTION OF THE DRAWINGS

FIG. 3 is a flow chart showing the procedures of orthogonality measurement according to the embodiment of the present invention;

FIG. 5 is a flow chart showing the procedures of orthogonality correction according to the embodiment of the present invention.

DESCRIPTION OF THE PREFERRED EMBODIMENT

A stage unit according to an embodiment of the present invention will be described below in detail.

Figure 1:
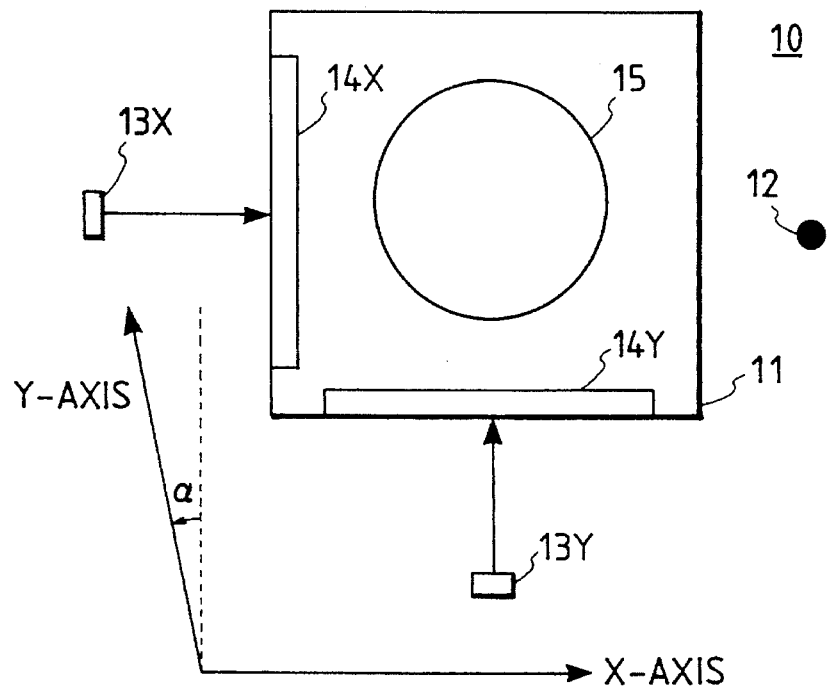
FIG. 1 is view schematically showing the arrangement of a stage unit using an orthogonality measurement method according to an embodiment of the present invention.

The arrangement of the apparatus of this embodiment will be described. Referring to FIG. 1, a stage unit 10 is constituted by a stage 11 which moves along a rectangular coordinate system (movement coordinate system) consisting of X- and Y-axes, and an XY position detection sensor 12 which is arranged on the movement coordinate system and detects the position of a mark in the movement coordinate system The orthogonality of the Y-axis with respect to the X-axis in the movement coordinate system (to be referred to as a stage orthogonality hereinafter) is defined as α (positive in the counterclockwise direction). Two plane mirrors 14X and 14Y for performing alignment using laser interferometers 13X and 13Y are fixed on the stage 11 to be perpendicular to each other. The stage 11 also has a rotatable substrate table 15 for mounting a substrate thereon. The stage 11 moves while its position on the movement coordinate system is detected by the plane mirrors 14X and 14Y and the laser interferometers 13X and 13Y. The XY position detection sensor 12 emits, e.g., a laser beam in a direction perpendicular to the sheet of drawing and detects diffracted light from a grating pattern formed on a substrate by a detector (not shown). With this arrangement, the stage is moved, and the pattern on the substrate is scanned by a laser beam. In accordance with a peak output from the detector, it is detected that the pattern is present immediately under the XY position detection sensor 12.

Figure 2:
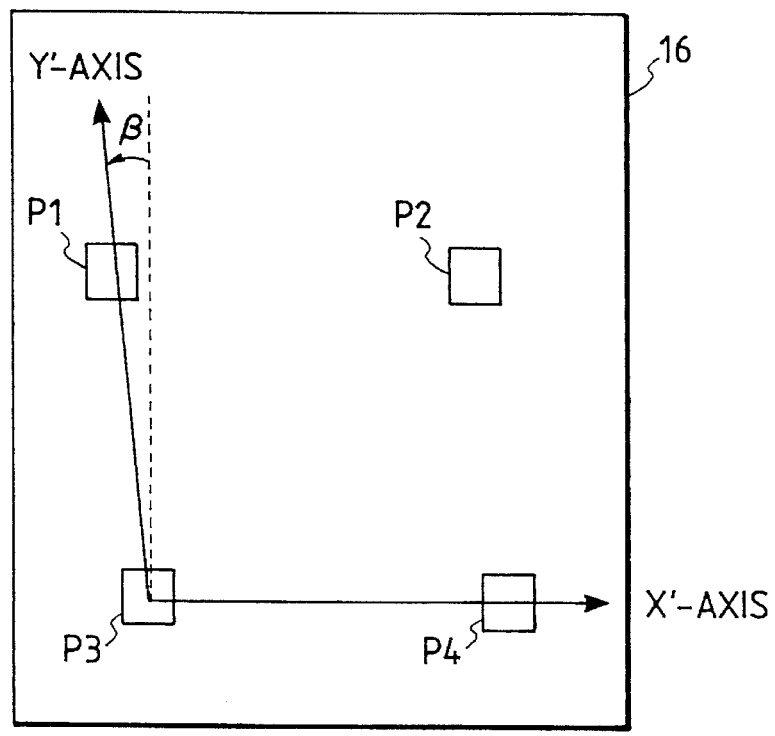
FIG. 2 is a view showing an orthogonality measurement substrate according to the embodiment of the present invention.

In this embodiment, a stage orthogonality measurement substrate 16 shown in FIG. 2 is arranged in advance. Four stage orthogonality measurement patterns P1 to P4 formed on a rectangular coordinate system consisting of X'- and Y'-axes (to be referred to as an array coordinate system hereinafter) are arranged on the substrate 16. The patterns P1 and P2, and the patterns P3 and P4 are respectively arranged to have the same Y'-coordinate values on the array coordinate system (i.e., the patterns P1 and P2, and P3 and P4 are respectively arranged on straight lines which are parallel to the X'-axis). The patterns P1 and P3, and P2 and P4 are respectively arranged to have the same X'-axis coordinate values on the array coordinate system (i.e., the patterns P1 and P3, and P2 and P4 are respectively arranged on straight lines which are parallel to the Y'-axis). The orthogonality of the Y'-axis with respect to the X'-axis in the array coordinate system (to be referred to as a pattern orthogonality hereinafter) is defined as β (positive in the counterclockwise direction).

Figure 4A:
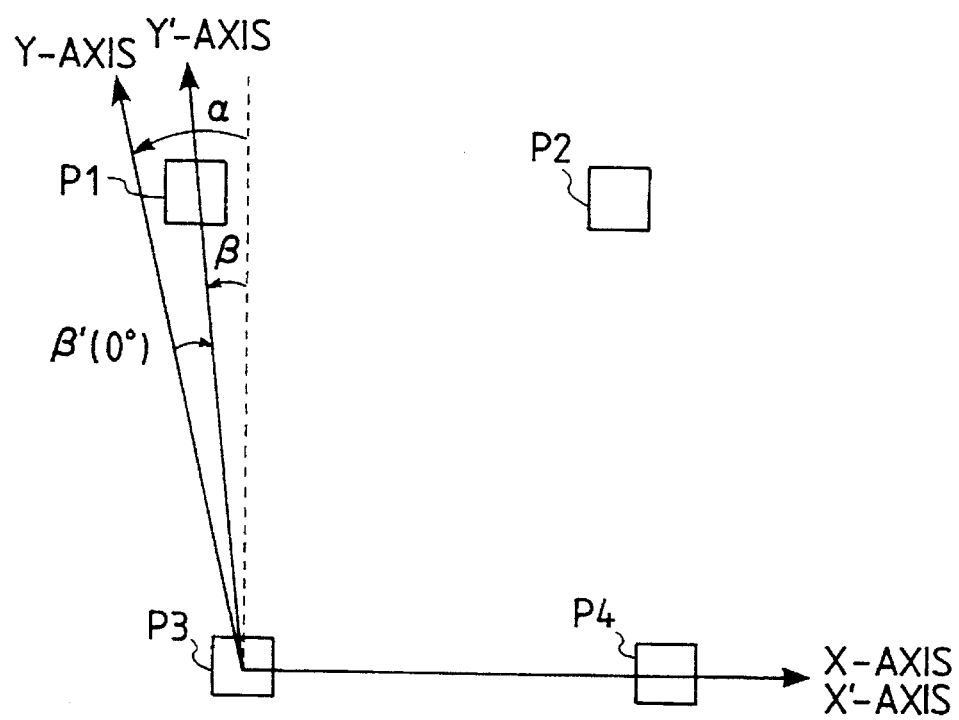
FIG. 4A is a view showing the relationship between the pattern array coordinate system and the stage coordinate system when the orthogonality measurement substrate is not rotated.
Figure 4B:
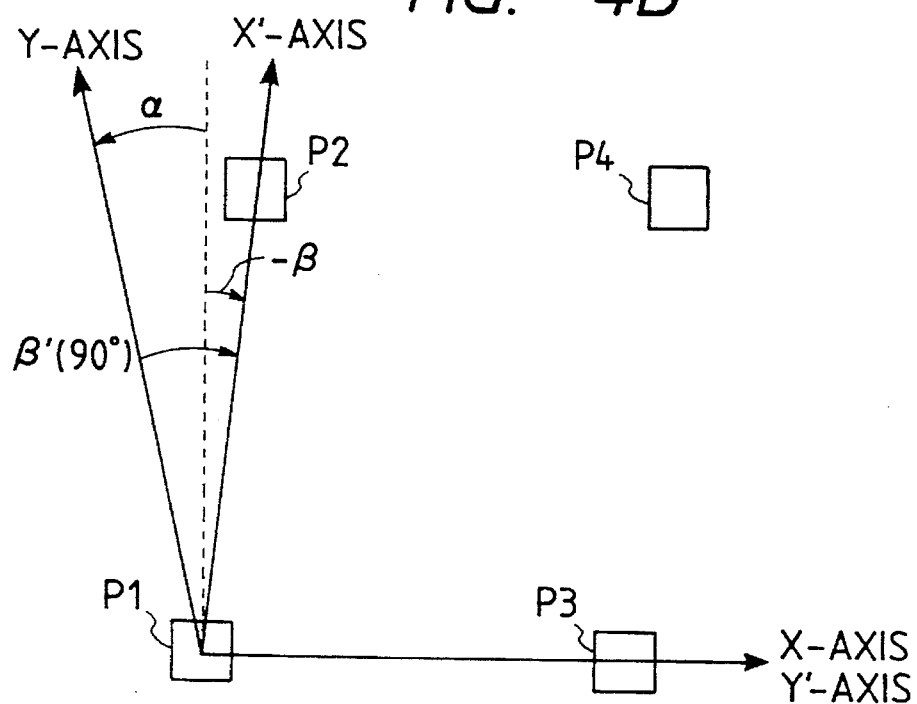
FIG. 4B is a view showing the relationship between the pattern array coordinate system and the stage coordinate system when the orthogonality measurement substrate is rotated by 90 degrees.
Figure 6:
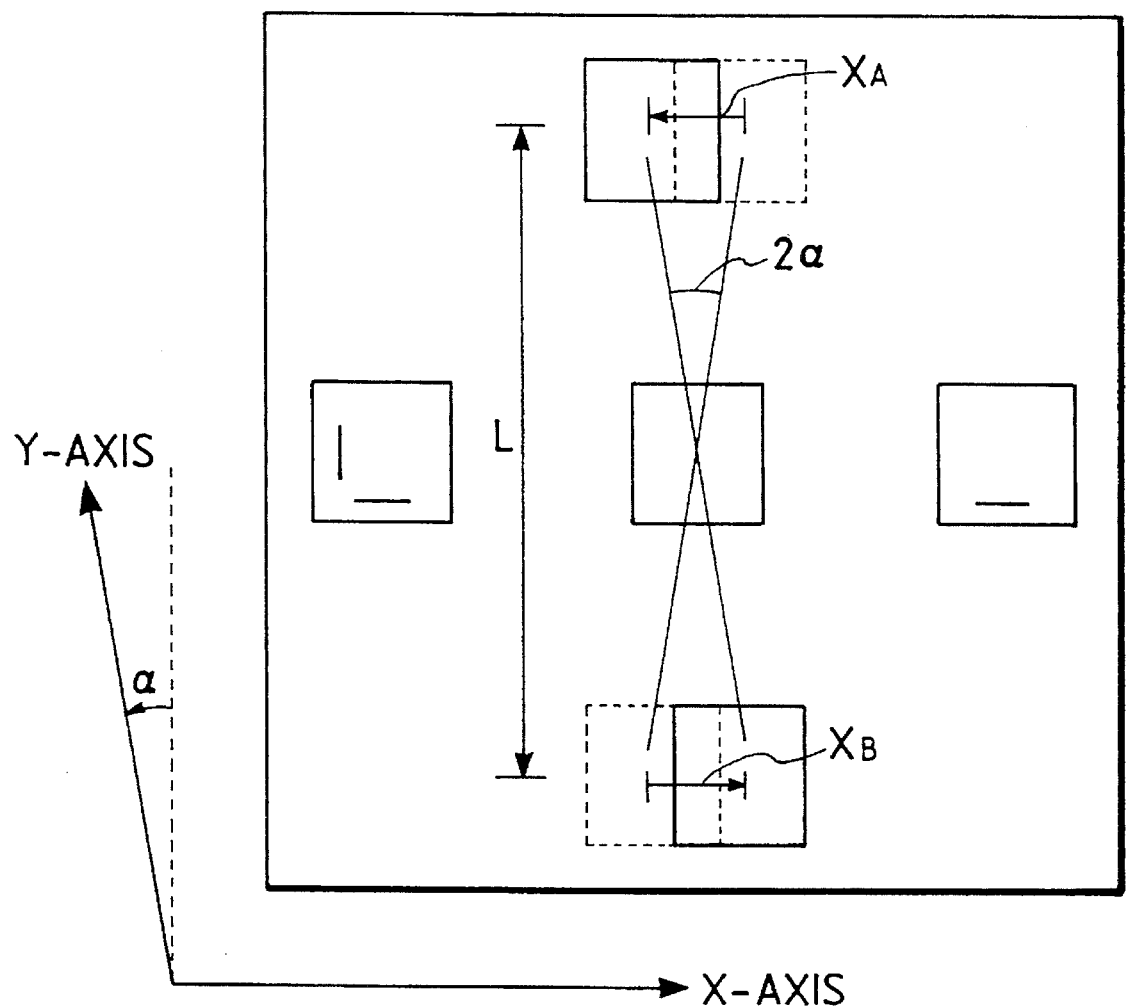
FIG. 6 is a view showing an orthogonality measurement method according to a prior art.

The principle and method of measurement of the stage orthogonality α in this embodiment will be described below with reference to FIGS. 3, 4A, and 4B. The substrate 16 is mounted on the substrate table 15, and the patterns P3 and P4 (or P1 and P2) are detected by the XY position detection sensor 12, thereby aligning the substrate 16 such that the X'-axis of the array coordinate system matches the X-axis of the stage coordinate system (step 100). The stage 11 is moved, and when each of the patterns P1 and P3 (or P2 and P4) on the substrate 16 is present immediately under the XY position detection sensor 12 (when the XY position detection sensor detects the pattern), the X- and Y-coordinate values of each pattern, which are obtained from the laser interferometers 13X and 13Y, are detected (step 110). The pattern orthogonality, β', (0°) at the stage coordinate system at no rotation of the substrate, as shown in FIG. 4A, is calculated from the obtained coordinate values (step 120). This orthogonality β' is represented by the following equation:

$$\beta'(0°)=\beta-\alpha$$

The substrate table 15 is rotated by 90 degrees, and the substrate 16 is aligned using the patterns P1 and P3 (or P2 and P4) such that the Y'-axis of the array coordinate system matches the X-axis of the movement coordinate system (steps 130 and 140). The stage 11 is moved, and when each of the patterns P1 and P2 (or P3 and P4) on the substrate 16 is present immediately under the XY position detection sensor 12, the X- and Y-coordinate values of each pattern, which are obtained from the laser interferometers 13X and 13Y, are detected (step 150). The pattern orthogonality β' (90°) at the movement coordinate system when the substrate is rotated by 90 degrees, as shown in FIG. 4B, is calculated from the obtained coordinate values (step 160). This orthogonality β'(90°) is represented by the following equation:

$$\beta'(90°)=-\beta-\alpha$$

On the basis of the obtained orthogonalities β' (0°) and β' (90°), the stage orthogonality β represented by the following equation is calculated (step 170):

$$\alpha=-\{\beta'(0°)+\beta'(90°)\}/2$$

The procedures of correcting the stage orthogonality α according to the present invention will be described below.

An orthogonality correction value A and two orthogonality allowance values B1 and B2 are set in advance for the stage unit. In the first orthogonality measurement, 0 is set as the correction value A. The allowance value B1 is determined in consideration of the reproducibility of orthogonality measurement while the allowance value B2 is determined in consideration of a maximum correction value for correction performed by the apparatus.

FIG. 5 is a flow chart showing the correction procedures. The stage orthogonality measurement method according to the present invention is used to measure the stage orthogonality α (step 200). It is determined whether the absolute value of the measured orthogonality α is equal to or smaller than the allowance value B1 (step 210). If YES in step 210, the correction procedures end. Otherwise, it is further determined whether the absolute value of the sum of the correction value A and the orthogonality α is equal to or smaller than the allowance value B2 (step 220). If YES in step 220, (A+α) is newly set as a correction value (step 230), thereby ending the correction procedures. Otherwise, an alarm message is indicated on, e.g., a CRT provided to the stage unit, thereby making notification to the operator (step 240). The orthogonality is corrected by adjusting the stage unit, and 0 is set as a correction value, thereby performing orthogonality measurement again (step 260).

When the above stage orthogonality measurement method is used for an exposure apparatus, two exposure operations and the operation of measuring shift amounts, which are necessary for the conventional test exposure, can be eliminated, thereby largely reducing the load of the stage orthogonality measurement operation. This allows orthogonality management by periodical orthogonality measurements to prevent an exposure failure due to a change in orthogonality. In this embodiment, to rotate the substrate by 90 degrees, the rotatable substrate table 15 is set on the stage and rotated, thereby rotating the substrate by 90 degrees. However, the method is not limited to this specific process, and the operator may directly rotate the substrate by 90 degrees and mount it again.

In the above embodiment, the four patterns P1 to P4 are arranged on the measurement substrate. However, as is apparent from the principle of measurement, it suffices to use only three of the above four measurement patterns.

The measurement patterns P1 and P2, and P3 and P4 are respectively arranged to have the same Y'-coordinate values on the array coordinate system, and the patterns P1 and P3, and P2 and P4 are respectively arranged to have the same X'-coordinate values on the array coordinate system. However, when alignment marks at no rotation and at a 90-degree rotation are independently arranged on the measurement substrate, one pattern on a straight line parallel to the X'-axis of the array coordinate system and one pattern on a straight line parallel to the Y'-axis, i.e., a total of two measurement patterns (i.e., two patterns having different X'- and Y'-coordinate values) need only be used.

A new stage orthogonality measurement substrate as that used in this embodiment need not be prepared for each measurement. With patterns consisting of a degradation-free material such as Cr, the substrate can be repeatedly used.

What is claimed is:

1. A method of measuring an orthogonality of a movement coordinate system of a stage unit having a stage which two-dimensionally moves along the movement coordinate system determined by first and second axes that cross each other, comprising the steps of:

mounting a measurement substrate having at least three measurement patterns on the stage, the at least three measurement patterns including at least two first patterns arranged on a straight line parallel to a third axis on an array coordinate system determined by the third and fourth axes crossing each other, and at least two second patterns arranged on a straight line parallel to the fourth axis;

aligning the third axis with respect to the first axis of the movement coordinate system;

obtaining a difference in an angle between the fourth axis of the array coordinate system and the second axis of the movement coordinate system as a first deviation by detecting positions of the second patterns on the movement coordinate system in an aligned state of aligning the third axis with respect to the first axis;

rotating the measurement substrate by 90 degrees from the aligned state and mounting the measurement substrate on the stage;

aligning the fourth axis with respect to the first axis of the movement coordinate system;

obtaining a difference in an angle between the third axis of the array coordinate system and the second axis of the movement coordinate system as a second deviation by detecting positions of the first patterns on the movement coordinate system in an aligned state of aligning the fourth axis with respect to the first axis; and obtaining the orthogonality of the movement coordinate system on the basis of the first and second deviations.

2. A method according to claim 1, wherein the third axis is aligned with respect to the first axis by detecting the positions of the first patterns, and the fourth axis is aligned with respect to the first axis by detecting the positions of the second patterns.

3. A method according to claim 1, wherein the measurement substrate has a plurality of alignment marks arranged along the array coordinate system, and the third axis is aligned with respect to the first axis and the fourth axis is aligned with respect to the first axis by detecting positions of the alignment marks.

* * * * *